(12) United States Patent
Murin et al.

(10) Patent No.: US 7,644,224 B2
(45) Date of Patent: Jan. 5, 2010

(54) FLASH MEMORY DEVICE AND METHOD

(75) Inventors: Mark Murin, Kfar Saba (IL); Arik Eyal, Raanana (IL)

(73) Assignee: SanDisk IL Ltd., Kfar Saba (IL)

( * ) Notice: Subject to any disclaimer, the term of this patent is extended or adjusted under 35 U.S.C. 154(b) by 201 days.

(21) Appl. No.: 11/450,443

(22) Filed: Jun. 12, 2006

(65) Prior Publication Data

US 2007/0113000 A1 May 17, 2007

Related U.S. Application Data

(60) Provisional application No. 60/736,459, filed on Nov. 15, 2005.

(51) Int. Cl.
*G06F 12/02* (2006.01)

(52) U.S. Cl. .................. 711/103; 711/159; 711/218

(58) Field of Classification Search .................. None
See application file for complete search history.

(56) References Cited

U.S. PATENT DOCUMENTS

| | | | | |
|---|---|---|---|---|
| 5,765,200 A | * | 6/1998 | McIlvain et al. ............ | 711/170 |
| 6,055,602 A | * | 4/2000 | McIlvain et al. ............ | 711/112 |
| 6,516,401 B2 | * | 2/2003 | Fukuhisa et al. ............ | 711/218 |
| 7,076,598 B2 | * | 7/2006 | Wang ....................... | 711/103 |
| 7,117,296 B2 | * | 10/2006 | Hosono et al. ............. | 711/103 |
| 2002/0023194 A1 | * | 2/2002 | Fukuhisa et al. ............ | 711/112 |
| 2003/0018849 A1 | * | 1/2003 | Takaichi .................... | 711/113 |

OTHER PUBLICATIONS

International Search Report and Written Opinion of the International Searching Authority for International Application No. PCT/IL06/01306, Mailed on May 6, 2008.

* cited by examiner

*Primary Examiner*—Than Nguyen
(74) *Attorney, Agent, or Firm*—Toler Law Group

(57) ABSTRACT

A flash memory device includes an array of memory cells for storing data pages, one or more buffers for retrieving the data pages and a logic mechanism that, responsive to a plurality of commands, transfers the data pages between the buffers and a host. Each command subsequent to a first command instructs retrieval of a data page whose address either precedes, or exceeds by more than 1, the address of the data page retrieved by the immediately preceding command, and at least one command does not explicitly specify the address of its retrieved data page. Another similar flash memory device uses two buffers to implement cache reads of data pages whose addresses are specified arbitrarily in the commands subsequent to the first command.

30 Claims, 2 Drawing Sheets

FLASH MEMORY DEVICE AND METHOD

CROSS-REFERENCE TO RELATED APPLICATIONS

This patent application claims the benefit of U.S. Provisional Patent Application No. 60/736,459, filed Nov. 15, 2005.

FIELD OF THE INVENTION

The present invention relates to the field of flash memory devices. More particularly, the present invention relates to using cache read operations in a flash memory device.

BACKGROUND OF THE INVENTION

Flash memory devices have been known for many years. Standard flash memory devices known in the art store data in a memory array, arranged in groups, called pages and/or blocks.

An example of a NAND flash memory device known in the art is Micron Technologies device No. MT29F2G08AABWP. The Data Sheet (herein under—DS) of this device is incorporated by reference for all purposes as if fully set forth herein.

When a Host (e.g. computer, controller or other similar device which a flash memory is connected to), which the flash memory device is connected to, exchanges data with the flash memory device, an entire data page is usually written to the memory array or read out of the memory array simultaneously, within one operation, from/to an internal buffer (or register) called a page buffer.

When the Host asserts a request instructing the flash memory device to read a page of data, the page of data is transferred from the memory array to the page buffer. The Host is allowed to assert a request instructing the flash memory device to start a new operation only after the page of data is fully read into the page buffer.

The time spent for data exchange between the Host and the flash memory device includes both Host < >Buffer and Buffer <>Memory Array transfer periods. As the data page size of existing flash memory devices increases, the Host <>Buffer transfer time increases as well, and becomes comparable to the Buffer < >Memory Array transfer time.

For example, in a NAND flash memory device known in the art having a 2 KByte data page, the Host <>Buffer transfer time is typically 50 to 100 microseconds per page, while Buffer <=Memory Array page read time is 20 to 50 microseconds per page and Buffer ⇒Memory Array page program (write) time is 200 to 800 microseconds per page.

Therefore, in order to increase the system's throughput, some flash memory devices include an additional data buffer—a cache buffer—for enabling a simultaneous data transfer between the Host and this cache buffer and between the page buffer and the memory array.

When a cache buffer is implemented in the flash memory device, the page of data is read from the memory array to the page buffer and then promptly transferred to the cache buffer, thus "freeing" the page buffer for receiving the next page of data from the memory array. In other words, the Host is allowed to assert a request to the flash memory device to read a next page of data from the memory array even before the previous page of data is fully transferred out of the cache buffer.

Therefore, implementing a cache buffer for page read operation substantially decreases the transfer delay time and increases the system's throughput.

A read operation using a cache buffer is called "Cache Read" or "Read with Cache" or "Cache Mode Page Read" (all depending on a specific flash device vendor). The read operation is responsive to specific commands triggered from the Host.

In reality, flash memory devices are provided for reading large amounts of data that are sequentially written to the flash memory. An example is a cluster of a file system containing several Kbytes of data, which is always written to and read from the flash memory device by the operating system as one "chunk". Other examples include information, which are "streamed" by a multimedia source (e.g. video, audio recording system), or an image taken by a digital camera.

In these cases it is likely that the next page of data, required to be read from the flash memory device, is a physically consecutive page of data stored in a memory array. Flash memory devices known in the art use this assumption when implementing a cache buffer for page read operation. For example, if the current read operation reads a page data from address N of the memory array, then the following cache read operation always retrieves a page data from address N+1 of the memory array.

However, there is a possibility that the "next consecutive page" assumption is no longer valid. One of such cases is an application, in which there is a need to read data pages in a "reverse" order, implementing, as an example, a LIFO (last-in-first-out) procedure. Implementing such an application may be required in a system that records events of different types over time and requires the option to look back for the recently recorded events of a certain type from time to time. In such systems, using the address of the last record (i.e. page of data) in order to quickly read a "previous" page of data may be very beneficial.

Existing flash memory devices used for cache reading operations are not configured to answer such needs. In other words, flash memory devices known in the art that include a cache buffer are not able to provide reading of pages of data in the "reverse" order (i.e. with decreasing page to page address). In order to achieve reading a "previous" page of data, existing methods simply apply a "regular" (not cached) page read operation and do not employ the cache buffer.

However, applying a "regular" page read operation degrades the system's throughput, in comparison with a regular cache read operation.

SUMMARY OF THE INVENTION

Accordingly, it is a principal object of the present invention to overcome the disadvantages of prior art techniques by introducing a flash memory device that is configured to allow a cache read operation of a previous page of data. The flash memory device of the present invention is further configured to allow a cache read operation of an arbitrary address.

A logic mechanism is responsive to commands received from the Host for transferring the data pages to/from the flash memory device and the Host. The logic mechanism is responsive to two different commands—a "normal" cache read command (i.e. incremented address) and a "reverse" cache read command (i.e. decremented address).

In accordance with the present invention, there is provided a flash memory device including: (a) an array of memory cells for storing a plurality of data pages; (b) at least one buffer for retrieving the plurality of data pages; and (c) a logic mechanism, that is responsive to a plurality of commands, for transferring the plurality of data pages that are retrieved to a host, wherein each of a second and subsequent command instructs the flash memory device to retrieve a data page whose address precedes, in the array an address of a data page retrieved by an immediately preceding command, and wherein at least one of command lacks an explicitly specified address of the retrieved data page.

According with a first flash memory device of the present invention, the decrement of addresses of successively read data pages are applied without the addresses of the data pages having to be specified explicitly. The first flash memory device includes an array of memory cells for storing the data pages, one or more buffers for retrieving the data pages, and a logic mechanism for transferring data pages retrieved by a previous command between the buffers and a host.

This last limitation, that at least one command lacks an explicitly specified address, and similar limitations of other methods and flash memory devices, described herein in accordance with the present invention, distinguish the present invention from the prior art that explicitly specifies all addresses and so implicitly specifies all increments.

Preferably, the addresses of the data pages retrieved by the second and subsequent commands precede the addresses of the data pages retrieved by the immediately preceding commands by a fixed decrement. Most preferably, the fixed decrement is hardwired to −1.

Preferably, each second and subsequent command includes a respective parameter value that specifies by how much the address of the data page retrieved by that command precedes the address of the data page retrieved by the immediately preceding command.

Preferably, the flash memory device includes two buffers—a page buffer and a cache buffer, thereby enabling a simultaneous data transfer of two data pages, one of the two data pages being transferred between the array of memory cells and the page buffer while another of the two data pages is transferred between the cache buffer and the host.

In accordance with the present invention, there is also provided a method for reading data pages from a flash memory, the method including the steps of: (a) issuing a first command, by a host, to instruct the flash memory to retrieve a first data page; (b) in response to the first command, retrieving the first data page, by a logic mechanism of the flash memory; (c) issuing at least one second command, by the host, instructing the flash memory to retrieve a corresponding data page whose address precedes an address of a data page retrieved in response to an immediately preceding command, at least one second command lacking an explicit specification of the address of the corresponding data page; and (d) in response to each second command, retrieving the corresponding data page, by the logic mechanism.

Preferably, the address of each data page retrieved by that command, subsequent to the data page retrieved by the first command, immediately precedes, in the flash memory array, the address of the data page retrieved by the immediately preceding command.

Preferably, each second command includes a respective parameter value that specifies by how much the address of the data page retrieved by that command precedes the address of the data page retrieved by the immediately preceding command.

Preferably, each second command is implemented as a cache read command.

In accordance with the present invention, there is also provided a flash memory device including: (a) an array of memory cells for storing a plurality of data pages; (b) at least one buffer for retrieving the plurality of data pages; and (c) a logic mechanism, that is responsive to a plurality of commands, for transferring the plurality of data pages that are retrieved to a host, wherein each of a second and subsequent command instructs the flash memory device to retrieve a data page whose address in the array exceeds, by more than 1, an address of a data page retrieved by an immediately preceding command, and wherein at least one of the at least one subsequent command lacks an explicitly specified address of the retrieved data page.

Preferably, each second and subsequent command includes a respective parameter value that specifies by how much the address of the data page retrieved by that command exceeds the address of the data page retrieved by the immediately preceding command.

Preferably, the flash memory device includes two buffers—a page buffer and a cache buffer, thereby enabling a simultaneous data transfer of two data pages, one of the two data pages being transferred between the array of memory cells and the page buffer while another of the two data pages is transferred between the cache buffer and the host.

In accordance with the present invention, there is also provided a method for reading data pages from a flash memory including the steps of: (a) issuing a first command, by a host, instructing the flash memory to retrieve a first data page; (b) in response to the first command, retrieving the first data page, by a logic mechanism of the flash memory; (c) issuing at least one second command, by the host, instructing the flash memory to retrieve a corresponding data page whose address exceeds, by more than 1, an address of a data page retrieved in response to an immediately preceding command, wherein at least one of the at least one second command lacks an explicit specification of the address of the corresponding data page; and (d) in response to each second command, retrieving the corresponding data page, by the logic mechanism.

Preferably, each second command includes a respective parameter value that specifies by how much the address of the corresponding data page retrieved by that command exceeds the address of the data page retrieved by the immediately preceding command.

Preferably, each second command is implemented as a cache read command.

In accordance with the present invention, there is also provided a flash memory device including: (a) an array of memory cells for storing a plurality of data pages; (b) two buffers, wherein one of the buffers is a page buffer and another buffer is a cache buffer, for retrieving the plurality of data pages, thereby enabling a simultaneous data transfer, at least in part, of two data pages, one of the two data pages being transferred between the array of memory cells and the page buffer while another of the two data pages is transferred between the cache buffer and a host; and (c) a logic mechanism, that is responsive to a plurality of commands for transferring at least two of the plurality of data pages that are retrieved to the host, wherein the transferring is effected through said page buffer and through said cache buffer, and wherein each of a second and subsequent command of the plurality of commands instructs the flash memory device to retrieve a data page from an arbitrarily specified address.

Preferably, each second and subsequent command includes a respective parameter value that specifies by how much the address of the corresponding data page retrieved by that command differs from the address of the data page retrieved by the immediately preceding command.

Preferably, the arbitrary address is specified explicitly.

In accordance with the present invention, there is also provided a method for reading data pages from a flash memory including the steps of: (a) issuing a first command, by a host, instructing the flash memory to retrieve a first data page; (b) in response to the first command, retrieving the first data page, by a logic mechanism of the flash memory; (c) issuing at least one cache read command, by the host, instructing the flash memory to retrieve a corresponding data page from an arbitrarily specified address; and (d) in response to each second command, retrieving the corresponding data page, by the logic mechanism.

Preferably, each cache read command includes a respective parameter value that specifies by how much the address of the corresponding data page retrieved by that command differs from the address of the data page retrieved by the immediately preceding command.

Preferably, each cache read command explicitly specifies the address of the corresponding data page retrieved by that command.

In accordance with the present invention, there is also provided a flash memory device including: (a) an array of memory cells for storing a plurality of data pages; (b) a page buffer; (c) a cache buffer; and (d) a logic mechanism, that is responsive to a plurality of commands, for simultaneously transferring, at least in part, of one of the plurality of data pages between the array of memory cells and the page buffer while another of the plurality of data pages is transferred between the cache buffer and a host, wherein an address of the data page that is transferred between the array of memory cells and the page buffer precedes, in the array, an address of the data page that is transferred between the cache buffer and the page host.

Preferably, the address of the data page that is transferred between the array of memory cells and the page buffer precedes, in the array, the address of the data page that is transferred between the cache buffer and the host by a fixed decrement. More preferably, the fixed decrement is −1.

In accordance with the present invention, there is also provided a method including the steps of: (a) issuing a first command, by a host, instructing the flash memory to retrieve a first data page; (b) issuing a second command, by a host, instructing the flash memory to retrieve a second data page; (c) in response to the first and second commands, substantially simultaneously retrieving, at least in part, the second data page from an array of memory cells to a page buffer and the first data page from a cache buffer to a host, wherein an address of the second data page precedes, in the array, an address of the first data page.

Preferably, the address of the second data page immediately precedes, in the array, the address of the first data page.

In accordance with the present invention, there is also provided a flash memory device including: (a) an array of memory cells for storing a plurality of data pages; (b) a page buffer; (c) a cache buffer; and (d) a logic mechanism, that is responsive to a plurality of commands, for simultaneously transferring, at least in part, of one of the plurality of data pages between the array of memory cells and the page buffer while another of the plurality of data pages is transferred between the cache buffer and a host, wherein an address of the data page that is transferred between the array of memory cells and the page buffer exceeds in the array, by more than 1, an address of the data page that is transferred between the cache buffer and the host.

In accordance with the present invention, there is also provided a method including the steps of: (a) issuing a first command, by a host, instructing the flash memory to retrieve a first data page; (b) issuing a second command, by a host, instructing the flash memory to retrieve a second data page; (c) in response to the first and second commands, substantially simultaneously retrieving, at least in part, the second data page from an array of memory cells to a page buffer and the first data page from a cache buffer to a host, wherein an address of the second data page exceeds in the array, by more than 1, an address of the first data page.

Additional features and advantages of the invention will become apparent from the following drawings and description.

BRIEF DESCRIPTION OF THE DRAWINGS

For a better understanding of the invention with regard to the embodiment thereof, reference is made to the accompanying drawings, in which like numerals designate corresponding sections or elements throughout, and in which.

DETAILED DESCRIPTION OF THE PREFERRED EMBODIMENTS

Figure 1:
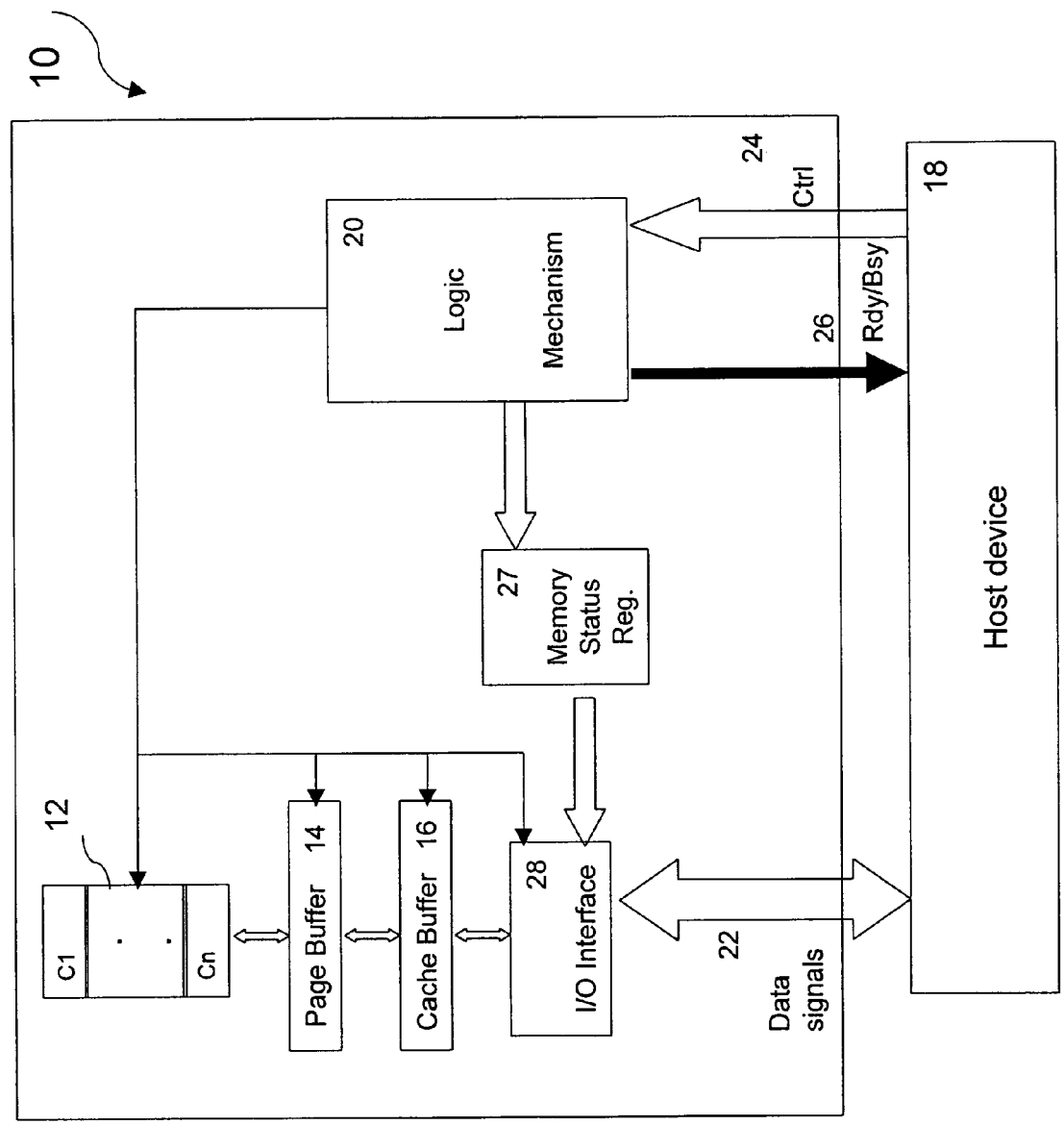
FIG. 1 is a block diagram of a flash memory device of the present invention.

The present invention is a flash memory device and method configured to allow a cache reading operation of both a previous data page and a next data page in a block. Such a configuration is required, for example, in a system that records events of different types over time and requires the option to quickly look back and read the recently recorded events of a certain type from time to time.

Existing methods which come to answer such needs apply a regular (not cached) page read operation. Therefore, unlike prior art regular read commands—the flash memory device configuration of the present invention answers the need of reading data page in any order while utilizing the advantages of the cache buffer.

A flash memory device of the present invention includes a memory array of memory cells for storing data pages. A Host device, which the flash memory device is connected to, transfers the data pages via data signals to/from an Input/Output (I/O) Interface unit.

A flash memory device of the present invention includes two buffers—a page buffer and a cache buffer. An entire data page is written to the memory array from the page buffer or read out of the memory array to the page buffer, whereas the cache buffer is provided to enable a simultaneous data transfer between the Host device and the cache buffer and between the page buffer and the memory array. The simultaneous data transfer increases the overall throughput of the flash memory device.

A logic mechanism is responsive to cache read commands received from the Host for transferring the data pages to/from the flash memory device and the Host. A cache read command is defined herein as a command instructing the flash memory device to employ both the page buffer and the cache buffer. The logic mechanism is responsive to two different commands—a "normal" cache read command (i.e. a positive increment which is an indication of an incremented address) and a "reverse" cache read command (i.e. a negative increment which is an indication of a decremented address).

Hence, upon receiving a "read with cache" command from the Host, the address of a last retrieved data page is either decremented or incremented for use by the subsequent read operation. Such method increases the flexibility of the design, while maintaining a maximal throughput.

The exemplary command codes and sequences described herein refer to the way in which the Micron Technologies device No. MT29F2G08AABWP is modified according to the principles of the present invention. However, it should be clear to those skilled in the art that the principles of the present invention can be commonly used on similar command codes and sequences to modify any flash memory device in the industry.

The way of operation of the "reverse" cache read command follows the way of operation of the "normal" cache read command known in the art, with the only difference that while the "normal" cache read command operates the logic mechanism to increment the address of a data page to be retrieved from the memory array, the "reverse" cache read commands operates the logic mechanism to decrement this address. Apart from this, the implementation of both cache read commands (including the functionality of the Ready/Busy signal and the implementations of command code 0x30 for a regular read command and command code 0x3F for retrieving a last required data page) are based on the same logic.

One way to provide the two "normal" and "reverse" cache read commands is by using a similar command code—for example a 0x32 read command code, thus creating a pair of cache read commands as follows: a 0x31 command code indicating a "normal" cache read command and a 0x32 command code indicating a "reverse" cache read command. Creating a pair of cache read commands as such is not vendor-specific and may be applied to modify the cache read command set of any flash device known in the art.

Referring to FIG. 1, there is shown a block diagram of a flash memory device 10 of the present invention. Flash memory device 10 includes a memory array 12 of memory cells C1 to Cn for storing data pages. A Host 18, which the flash memory device is connected to, transfers the data pages via Data signals 22 to/from an Input/Output (I/O) Interface unit 28.

An entire data page is written to memory array 12 from a Page Buffer 14 or read out of memory array 12 to Page Buffer 14. Flash memory device 10 includes an additional data buffer—a Cache Buffer 16 for enabling a simultaneous data transfer between Host 18 and Cache Buffer 16 and between Page Buffer 14 and memory array 12.

A Logic Mechanism 20 is provided for transferring the data pages to/from the flash memory device and Host 18. Logic Mechanism 20 is responsive to "normal" and "reverse" cache read commands received from Host 18 via Control signals 24 and Data signals 22.

Status information, notifying Host 18 that page "N" is ready to be read by Host 18, is optionally provided to Host 18 from a Memory Status register 27 connected to the Logic Mechanism 20. The status information is transferred from the Memory Status register 27 to the Host device 18 via the Input/Output (I/O) Interface unit 28.

Figure 2:
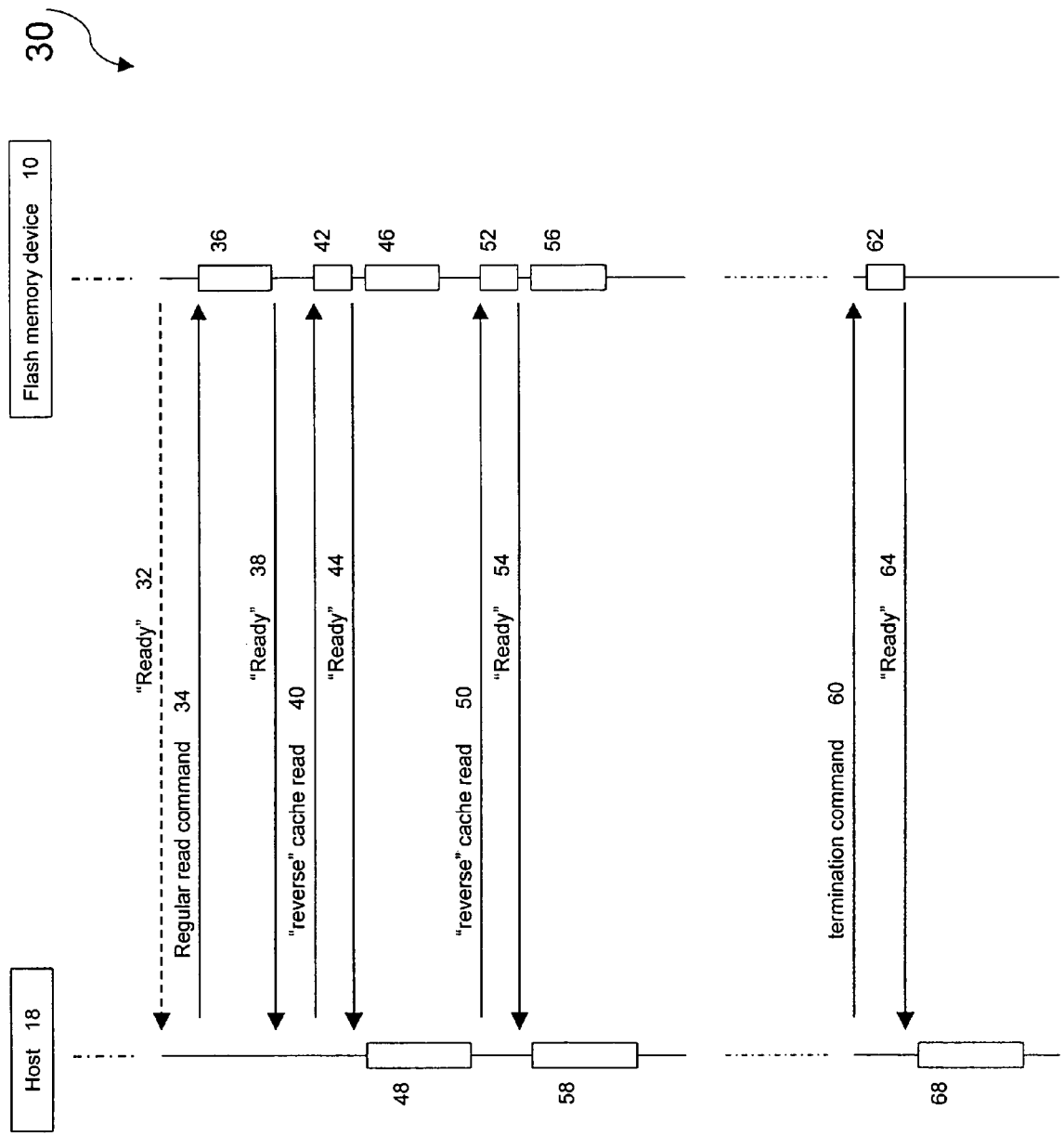
FIG. 2 is a timing diagram of the method of the present invention, demonstrating the processes applied between the Host and the flash memory for reading previous data pages.

Referring now to FIG. 2, there is shown a timing diagram 30 of the method of the present invention, demonstrating the signals exchanged between the Host 18 and the flash memory device 10 for reading previous data pages.

Upon receiving a "Ready" signal 32 from flash memory device 10 notifying Host 18 that flash memory device 10 is available for reading, Host 18 sends flash memory device 10 a regular read command 34 (for example, as command code 0x30) along with the five ADRESS cycles, requesting flash memory device 10 to retrieve a data page stored at address "N" (referred to as page "N" herein), and waits for the completion of the read.

Upon receiving regular read command 34 from Host 18, flash memory device 10 retrieves data page "N" (process 36) from the memory array to the page buffer (which typically lasts 30 μ seconds).

After data page "N" is fully retrieved from the memory array to the page buffer, flash memory device 10 sends a second "Ready" signal 38 notifying Host 18 that page "N" is ready to be read by the Host 12. Alternatively, Host 18 polls the Memory Status register 27 implemented in the flash memory device 10, notifying Host 18 that page "N" is ready to be read by the Host 18.

At this point, Host 18, instead of reading page "N" from the page buffer, issues the flash memory device 10 the next command—a "reverse" cache read command 40 (for example, as command code 0x32), requesting flash memory device 10 to retrieve the previous data page (page "N−1") from flash memory device 10.

This "reverse" cache read command 40 triggers flash memory device 10 to transfer the contents of page "N" (storing the data of the page recently read from the memory array) from the page buffer to the cache buffer (process 42). This procedure typically lasts 1.5 μ seconds.

After page "N" is fully transferred from the page buffer to the cache buffer, the data page address is decremented by 1 (i.e. the data page address becomes N−1) and flash memory device 10 sends a third "Ready" signal 44 notifying Host 18 that page "N" is ready to be read by Host 18. At this point, flash memory device 10 retrieves the previous data page (page "N−1") from the memory array to the page buffer (process 46) simultaneously with sending the third "Ready" signal 44.

Upon receiving the third "Ready" signal 44 from flash memory device 10, Host 18 reads page "N" from the cache buffer (process 48). This read operation is performed by Host 18 simultaneously with the retrieval of page "N−1" (process 46) from the memory array to the page buffer.

After page "N" is fully read by Host 18 from the cache buffer, Host 18 issues a second "reverse" cache read command 50, requesting flash memory device 10 to retrieve the previous data page (page "N−2") from flash memory device 10.

Second "reverse" cache read command 50 triggers flash memory device 10 to transfer the contents of page "N−1" from the page buffer to the cache buffer (process 52) only after the transfer of page "N−1" from the memory array to the page buffer terminates.

After page "N−1" is fully transferred from the page buffer to the cache buffer, the data page address is decremented by 1 (i.e. the data page address becomes N−2) and flash memory device 10 sends a fourth "Ready" signal 54 notifying Host 18 that page "N−1" is ready to be read by the Host 18. At this point, flash memory device 10 retrieves the previous data page (page "N−2") from the memory array to the page buffer (process 56) simultaneously with sending the fourth "Ready" signal 54.

Upon receiving fourth "Ready" signal 54 from flash memory device 10, Host 18 reads page "N−1" from the cache buffer. This read operation is performed by Host 18 simultaneously with the retrieval of page "N−2" (process 56) from the memory array to the page buffer.

In order to terminate the sequence of "reverse" cache read operations, Host 18 issues flash memory device 10 a cache read termination command 60 (for example, as a 0x3F command code) to read a last required data page (e.g. page "N−M", where M>2) from the flash memory device 10.

Cache read termination command 60 triggers flash memory device 10 to transfer the contents of page "N−M" from the page buffer to the cache buffer (process 62).

After page "N–M" is fully transferred from the page buffer to the cache buffer, flash memory device 10 sends a final "Ready" signal 64 notifying Host 18 that page "N–M" is ready to be read by Host 18.

At the final stage, upon receiving the final "Ready" signal 64 from flash memory device 10, Host 18 proceeds to read the final page "N–M" from the cache buffer (process 68).

In accordance with a second embodiment, the flash memory device of the present invention employs both the page buffer and the cache buffer and operates in response to cache read commands, received from the Host, that specify an arbitrary address increment (i.e. any non zero integer) between successively read data pages. As such, the logic mechanism is implemented to be responsive to any cache read command instructing the flash memory device to retrieve a data page from an arbitrary address increment, not just an increment hardwired to +1 as in the prior art or hardwired to –1 as in the first embodiment of the present invention.

Note that the address targeted by the arbitrary increment must be within the constraints of the memory array size. Note that a negative address "increment" is defined herein as an address decrement.

So, for example, sending an address increment of +5 to the flash memory instructs the flash memory to return the pages stored at addresses "N", "N+5", "N+10", etc., until the cache read is terminated; and sending an address increment of –5 to the flash memory instructs the flash memory to return the pages stored at addresses "N", "N–5", "N–10", etc., until the cache read is terminated.

Preferably, the arbitrary address increment is set by the Host and sent to the flash memory device as a parameter command. This parameter command relates to all following cache read commands until overridden.

This can be implemented, for example, by initially sending the flash memory device a command code 0xAA specifying the flash memory device the value of the arbitrary address increment (e.g. "5"), such that the following cache read commands (either "reverse" or "normal") all relate to this value. In case of a "reverse" cache read command, the value received via command code 0xAA is an indication of a decrement number ("–5"). In case of a "normal" cache read command, this value is an indication of an increment number ("+5"). Such procedure continues as long as the consecutive cache read commands received from the Host are accompanied by an address increment command (or until a cache read termination command is asserted).

Alternatively, each cache read command received from the Host is accompanied by a respective set parameter command specifying the address increment for this cache read command. Such a case can be implemented, for example, by sending a respective command code 0xAA to the flash memory device after each cache read command.

Alternatively, the respective parameter accompanying each cache read command received from the Host is an indication of an explicitly specified data page address rather than of an address increment. Since all the read commands subsequent to the first read command are implemented as cache read commands, this alternative implementation of the second embodiment differs from prior art non-cache read commands that specify explicit addresses.

Hence, unlike prior art regular read commands—the flash memory device configuration of the present invention answers the need of reading data page in any order while utilizing the advantages of the cache buffer.

It should be noted that the present invention relates to a NAND flash memory device. However, it can be understood that other implementations are possible within the scope of the invention, thus relating to any device and method applicable to operate in response to cache read commands received from the host.

Having described the invention with regard to a certain specific embodiment thereof, it is to be understood that the description is not meant as a limitation, since further modifications will now suggest themselves to those skilled in the art, and it is intended to cover such modifications as fall within the scope of the appended claims.

The invention claimed is:

1. A flash memory device comprising:
 an array of memory cells for storing a plurality of data pages;
 at least one buffer for retrieving said plurality of data pages; and
 a logic mechanism responsive to a plurality of commands for transferring said retrieved plurality of data pages to a host, said plurality of commands being such that:
  each subsequent command subsequent to a first command instructs the flash memory device to retrieve a data page whose address, in said array, precedes an address of a data page retrieved by an immediately preceding command of the plurality of commands, and
  at least one command of said plurality of commands lacks an explicit specification of an address of said data page that is to be retrieved in response to said at least one command.

2. The flash memory device of claim 1, wherein said address, of said data page retrieved in response to said each subsequent command, precedes said address of said data page retrieved by said immediately preceding command by a fixed decrement.

3. The flash memory device of claim 2, wherein said fixed decrement is one.

4. The flash memory device of claim 1, wherein said each subsequent command includes a respective parameter value that specifies by how much said address of said data page, that is retrieved in response to said each subsequent command, precedes said address of said data page that is retrieved in response to said immediately preceding command that immediately precedes said each subsequent command.

5. The flash memory device of claim 1, further comprising two buffers, wherein one of said two buffers is a page buffer and another of said two buffers is a cache buffer, the two buffers enabling a simultaneous data transfer of two data pages of said plurality of data pages, one of said two data pages being transferred between said array of memory cells and said page buffer while another of said two data pages is transferred between said cache buffer and said host.

6. The flash memory device of claim 1, wherein each of said plurality of commands is for transferring a single said data page to said host.

7. A method for reading data pages from a flash memory, the method comprising:
 receiving a first command, from a host of the flash memory, instructing the flash memory to retrieve a first data page;
 in response to said first command, retrieving said first data page by a logic mechanism of the flash memory;
 receiving one or more second commands from said host instructing the flash memory to retrieve a respective second data page whose address precedes an address of a data page retrieved in response to an immediately preceding command, at least one of the one or more second commands lacking an explicit specification of said address of said respective second data page; and in response to each of the one or more second commands, retrieving said respective second data page, by said logic mechanism.

8. The method of claim 7, wherein an address of each retrieved data page, subsequent to said first data page, immediately precedes, in the flash memory, said address of said data page retrieved in response to said immediately preceding command.

9. The method of claim 7, wherein each of the one or more second commands includes a respective parameter value that specifies by how much said address of said respective second data page that is retrieved in response to said each of the one or more second commands precedes said address of said data page that is retrieved in response to said immediately preceding command.

10. The method of claim 7, wherein each of the one or more second commands is implemented as a cache read command.

11. The method of claim 7, wherein said first command instructs the flash memory to retrieve only said first data page and wherein said each of the one or more second commands instructs the flash memory to retrieve only said respective second data page.

12. A flash memory device comprising:
an array of memory cells for storing a plurality of data pages;
at least one buffer for retrieving said plurality of data pages; and
a logic mechanism responsive to a plurality of commands for transferring said retrieved plurality of data pages to a host, said plurality of commands being such that:
each subsequent command subsequent to a first command instructs the flash memory device to retrieve a data page whose address in said array exceeds, by more than 1, an address of a data page retrieved by an immediately preceding command of said plurality of commands, and
at least one command subsequent to said first command lacks an explicit specification of an address of said data page that is to be retrieved in response to said at least one command.

13. The flash memory device of claim 12, wherein said each subsequent command includes a respective parameter value that specifies by how much said address of said data page, that is retrieved in response to said each subsequent command, exceeds said address of said data page that is retrieved in response to said immediately preceding command that immediately precedes said each subsequent command.

14. The flash memory device of claim 12, further comprising two buffers, wherein one of said two buffers is a page buffer and another of said two buffers is a cache buffer, the two buffers enabling a simultaneous data transfer of two data pages of said plurality of data pages, one of said two data pages being transferred between said array of memory cells and said page buffer while another of said two data pages is transferred between said cache buffer and said host.

15. The flash memory device of claim 12, wherein each of said plurality of commands is for transferring a single said data page to said host.

16. A method for reading data pages from a flash memory, the method comprising:
receiving a first command, from a host of the flash memory, instructing the flash memory to retrieve a first data page;
in response to said first command, retrieving said first data page by a logic mechanism of the flash memory;
receiving one or more second commands from said host instructing the flash memory to retrieve a respective second data page whose address exceeds, by more than 1, an address of a data page retrieved in response to an immediately preceding command, wherein at least one of said one or more second commands lacks an explicit specification of said address of said respective second data page; and
in response to each of the one or more second commands, retrieving said respective second data page, by said logic mechanism.

17. The method of claim 16, wherein each of the one or more second commands includes a respective parameter value that specifies by how much said address of said respective second data page that is retrieved in response to said each of the one or more second commands exceeds said address of said data page that is retrieved in response to said immediately preceding command.

18. The method of claim 16, wherein each of the one or more second commands is implemented as a cache read command.

19. The method of claim 16, wherein said first command instructs the flash memory to retrieve only said first data page and wherein said each of the one or more second commands instructs the flash memory to retrieve only said respective second data page.

20. A flash memory device comprising:
an array of memory cells for storing a plurality of data pages;
two buffers for retrieving said plurality of data pages, wherein one of said two buffers is a page buffer and another of said two buffers is a cache buffer, the two buffers enabling simultaneous data transfer of two data pages of said plurality of data pages, one of said two data pages being transferred between said array of memory cells and said page buffer while another of said two data pages is transferred between said cache buffer and a host; and
a logic mechanism responsive to a plurality of commands for transferring said plurality of data pages to said host, said plurality of commands being such that each subsequent command subsequent to a first command of said plurality of commands instructs the flash memory device to retrieve a respective data page from an arbitrarily specified address, wherein the logic mechanism transfers said plurality of data pages to the host via said page buffer and said cache buffer, wherein a first data page is transferred from the array of memory cells to the page buffer while a second data page is transferred from the cache buffer to the host, the first data page retrieved from said arbitrarily specified address in response to each subsequent command, and the second data page retrieved in response to an immediately preceding command, wherein said each subsequent command includes a respective parameter value that specifies by how much said address of the first data page that is retrieved in response to said each subsequent command differs from said address of the second data page that is retrieved in response to said immediately preceding command.

21. The flash memory device of claim 20, wherein the respective parameter value specifies an arbitrary address increment.

22. The flash memory device of claim 20, wherein said arbitrarily specified address is specified explicitly.

23. The flash memory device of claim 20, wherein, if said logic mechanism receives three commands successively, an interval between an address specified by said first command and an address specified by a second command is different from an interval between said address specified by said second command and an address specified by a third command.

24. A method for reading data pages from a flash memory, the method comprising:
receiving a first command, from a host of the flash memory, instructing the flash memory to retrieve a first data page;
in response to said first command, retrieving said first data page by a logic mechanism of the flash memory;
receiving one or more cache read commands from said host instructing the flash memory to retrieve a respective second data page from an arbitrarily specified address; and
in response to each of the one or more cache read commands, retrieving said respective second data page, by said logic mechanism, wherein said each of the one or more cache read commands includes a respective parameter value that specifies by how much said address of said respective second data page that is retrieved in response to said each of the one or more cache read commands differs from said address of said data that is retrieved in response to a command that immediately precedes said each of the one or more cache read commands.

25. The method of claim 24, wherein the respective parameter value specifies an arbitrary address increment.

26. The method of claim 24, wherein each of the one or more cache read commands explicitly specifies said address of said respective second data page that is retrieved in response to said each of the one or more cache read commands.

27. The method of claim 24, wherein a plurality of said one or more cache read commands are issued by said host.

28. The method of claim 27, wherein an interval between an address specified by said first command and an address specified by a first cache read command is different from an interval between said address specified by said first cache read command and an address specified by a second cache read command.

29. A flash memory device comprising:
an array of memory cells for storing a plurality of data pages;
two buffers for retrieving said plurality of data pages, wherein one of the two buffers is a page buffer and another of the two buffer is a cache buffer, the two buffers enabling simultaneous data transfer of two data pages of the plurality of data pages, one of the two data pages being transferred between the array of memory cells and the page buffer while another of the two data pages is transferred between the cache buffer and a host; and
a logic mechanism responsive to a plurality of commands for transferring said plurality of data pages to said host, said plurality of commands being such that each subsequent command subsequent to a first command of said plurality of commands instructs the flash memory device to retrieve a respective data page from an arbitrarily specified address,
wherein the logic mechanism transfers said plurality of data pages to the host via said page buffer and said cache buffer, with each data page that is retrieved from said arbitrarily specified address in response to each subsequent command being transferred from said array of memory cells to said page buffer while a data page that is retrieved in response to an immediately preceding command that immediately precedes said each subsequent command is transferred from said cache buffer to said host, and
wherein, if said logic mechanism receives three commands successively, an interval between an address specified by a first of the three commands and an address specified by a second of the three commands is different from an interval between said address specified by said second of the three commands and an address specified by a third of the three commands.

30. A method for reading data pages from a flash memory, the method comprising:
receiving a first command, from a host of the flash memory, instructing the flash memory to retrieve a first data page;
in response to said first command, retrieving said first data page by a logic mechanism of the flash memory;
receiving one or more cache read commands from said host instructing the flash memory to retrieve a respective second data page from an arbitrarily specified address; and
in response to each of said one or more cache read commands, retrieving said respective second data page, by said logic mechanism, wherein a plurality of said one or more cache read commands are issued by said host, and wherein an interval between an address specified by said first command and an address specified by a first cache read command is different from an interval between said address specified by said first cache read command and an address specified by a second cache read command.

* * * * *

UNITED STATES PATENT AND TRADEMARK OFFICE
CERTIFICATE OF CORRECTION

PATENT NO. : 7,644,224 B2 Page 1 of 1
APPLICATION NO. : 11/450443
DATED : January 5, 2010
INVENTOR(S) : Mark Murin et al.

It is certified that error appears in the above-identified patent and that said Letters Patent is hereby corrected as shown below:

Column 13, Claim 24, Line 20, "commands differs from said address of said data that is" should read --commands differs from said address of said data page that is--.

Signed and Sealed this

Thirtieth Day of March, 2010

David J. Kappos
*Director of the United States Patent and Trademark Office*